United States Patent
You

(10) Patent No.: US 8,513,754 B2
(45) Date of Patent: Aug. 20, 2013

(54) SOLAR CELL, METHOD OF FORMING EMITTER LAYER OF SOLAR CELL, AND METHOD OF MANUFACTURING SOLAR CELL

(75) Inventor: JaeSung You, Seoul (KR)

(73) Assignee: LG Electronics Inc., Seoul (KR)

( * ) Notice: Subject to any disclaimer, the term of this patent is extended or adjusted under 35 U.S.C. 154(b) by 172 days.

(21) Appl. No.: 13/172,696

(22) Filed: Jun. 29, 2011

(65) Prior Publication Data

US 2011/0253209 A1   Oct. 20, 2011

Related U.S. Application Data

(62) Division of application No. 12/425,691, filed on Apr. 17, 2009, now Pat. No. 7,985,610.

(30) Foreign Application Priority Data

Apr. 17, 2008   (KR) .......................... 10-2008-0035588

(51) Int. Cl.
| | |
|---|---|
| *H01L 29/732* | (2006.01) |
| *H01L 31/072* | (2012.01) |
| *H01L 27/14* | (2006.01) |
| *H01L 31/00* | (2006.01) |

(52) U.S. Cl.
USPC ............... 257/431; 257/79; 257/80; 257/184; 257/460; 257/E21.135; 257/E21.159; 257/E21.487; 136/244; 136/252; 136/256

(58) Field of Classification Search
USPC ............ 257/79–80, 184, 431, 460, E21.135, 257/E21.159, E21.487; 136/244, 252, 256
See application file for complete search history.

(56) References Cited

U.S. PATENT DOCUMENTS

| | | | |
|---|---|---|---|
| 6,429,037 B1 | 8/2002 | Wenham et al. | |
| 7,795,527 B2 | 9/2010 | Wada | |
| 7,851,698 B2 | 12/2010 | De Ceuster et al. | |

(Continued)

FOREIGN PATENT DOCUMENTS

| | | |
|---|---|---|
| EP | 1 887 633 | 2/2008 |
| JP | 56-15035 A | 2/1981 |

(Continued)

OTHER PUBLICATIONS

Besu-Vetrella et al., "Large Area, Screen Printed Silicon Solar Cells with Selective Emitter Made by Laser Overdoping and RTA Spin-On Glasses", 26th PVSC, Sep. 30-Oct. 3, 1997, pp. 135-138, XP010267745.

(Continued)

*Primary Examiner* — Mohsen Ahmadi
(74) *Attorney, Agent, or Firm* — Birch, Stewart, Kolasch & Birch, LLP

(57) ABSTRACT

A solar cell includes a substrate of a first conductive type; an emitter layer that is positioned on the substrate and is a second conductive type that is opposite to the first conductive type; first electrodes that are connected to the emitter layer; and a second electrode that is connected to the substrate, wherein the emitter layer includes a first emitter portion and a second emitter portion, the first electrodes include a finger electrode, and a bus electrode intersecting and connected to the finger electrode, and the first emitter portion and the second emitter portion are positioned under the bus electrode.

10 Claims, 7 Drawing Sheets

(56) References Cited

U.S. PATENT DOCUMENTS

| | | | |
|---|---|---|---|
| 8,227,881 B2 * | 7/2012 | Park | 257/431 |
| 2005/0016580 A1 | 1/2005 | Haga | |
| 2007/0215203 A1 | 9/2007 | Ishikawa et al. | |
| 2007/0290283 A1 | 12/2007 | Park et al. | |
| 2007/0295381 A1 | 12/2007 | Fujii et al. | |
| 2008/0026550 A1 | 1/2008 | Werner et al. | |
| 2009/0056807 A1 | 3/2009 | Chen et al. | |
| 2009/0223703 A1 * | 9/2009 | Winoto | 174/257 |
| 2009/0227061 A1 | 9/2009 | Bateman et al. | |

FOREIGN PATENT DOCUMENTS

| | | |
|---|---|---|
| JP | 59-79580 A | 5/1984 |
| JP | 63-148685 A | 6/1988 |
| JP | 4-356972 A | 12/1992 |
| JP | 5-29638 A | 2/1993 |
| JP | 5-275722 A | 10/1993 |
| JP | 2000-183379 A | 6/2000 |
| JP | 2007-109924 A | 4/2007 |
| KR | 10-2001-0004129 A | 1/2001 |
| KR | 10-2004-0100407 A | 12/2004 |
| KR | 102007-0106818 A | 11/2007 |

OTHER PUBLICATIONS

Carlsson et al., "Laser Doping for Selective Silicon Solar Cell Emitter", 21st European Photovoltaic Solar Energy Conference, Sep. 4-8, 2006, pp. 938-940, XP040512319.

Einhaus et al., "Optimisation of a Selective Emitter Process for Multicrystalline Silicon Solar Cells to Meet Industrial Requirements", 14th European Photovoltaic Solar Energy Conference, Jun. 30-Jul. 4, 1997, pp. 187-190, XP001136015.

Esturo-Breton et al., "Laser Doping for Crystalline Silicon Solar Cell Emitters", 20th European Photovoltaic Solar Energy Conference, Jun. 6-10, 2005, pp. 851-854, XP040511456.

* cited by examiner

Movement direction of substrate

SOLAR CELL, METHOD OF FORMING EMITTER LAYER OF SOLAR CELL, AND METHOD OF MANUFACTURING SOLAR CELL

This application is a Divisional of co-pending application Ser. No. 12/425,691 filed on Apr. 17, 2009 now U.S. Pat. No. 7,985,610, which claims priority to Korean Patent Application No. 10-2008-0035588 filed on Apr. 17, 2008. The entire contents of all of the above applications are hereby incorporated by reference.

BACKGROUND OF THE INVENTION

1. Field

Embodiments relate to a solar cell, a method for forming an emitter layer of the solar cell, and a method for manufacturing the solar cell.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source, and do not cause environmental pollution.

A general solar cell includes a substrate and an emitter layer made of a semiconductor having different conductive types such as a p-type and an n-type, and electrodes formed on the substrate and the emitter layer, respectively. The general solar cell also includes a p-n junction formed at an interface between the substrate and the emitter layer.

When light is incident on the solar cell, a plurality of electron-hole pairs are generated in the semiconductor. The electron-hole pairs are separated into electrons and holes by the photovoltaic effect, respectively. Thus, the separated electrons move toward the n-type semiconductor (e.g., the emitter layer) and the separated holes move the p-type semiconductor (e.g., the substrate), and then the electrodes and holes are collected by the electrodes electrically connected to the emitter layer and the substrate, respectively. The electrodes are connected to each other using electric wires to thereby obtain an electric power.

SUMMARY

According to an embodiment of the present invention, a method for forming an emitter layer of a solar cell includes preparing a substrate including a first impurity of a first conductive type, diffusing a second impurity of a second conductive type opposite to the first conductive type in the substrate to form a first emitter portion of the emitter layer in the substrate, and selectively heating a portion of the first emitter portion, which corresponds to a position for forming at least one electrode to form a second emitter portion.

According to another embodiment of the present invention, a method for manufacturing a solar cell includes forming the emitter layer for the above solar cell, forming first electrodes connected to the first and second emitter portions, and a second electrode connected to the substrate, wherein the first electrodes comprise at least one finger electrode formed along the second emitter portion and at lease one bus electrode intersecting and connected to the at least one finger electrode.

The at least one electrode may include a finger electrode and a bus electrode, and the second emitter portion is formed under the finger electrode.

The forming of the first emitter portion may include supplying an impurity gas of the second conductive type in a diffusion furnace to diffuse an impurity included in the impurity gas in the substrate to form the first emitter portion, and generating an insulation layer including the impurity on the substrate.

The forming of the first emitter portion may include coating an impurity source including an impurity of the second conductive type on the substrate or printing a doping paste including the impurity of the second conductive type on the substrate, and heating the substrate with the coated impurity source or the printed doping paste to diffuse the impurity in the substrate to form the first emitter portion, and generating an insulation layer including the impurity on the first emitter portion.

The insulation layer may be PSG (phosphorus silicate glass).

The forming of the second emitter portion may include irradiating laser beams on the insulation layer, so that a portion of the first emitter portion underlying a portion of the insulation layer, on which the laser beams are irradiated, is heated.

The laser beams may have an irradiation width more than a width of the at least one electrode.

An irradiation position of the laser beams may be moved by at least one of changing an emitting position of the laser beams and changing a position of the substrate.

The second emitter portion may have a sheet resistance less than a sheet resistance of the first emitter portion.

The second emitter portion may have an impurity concentration that is more than an impurity concentration of the first emitter portion and/or the second emitter portion may have an impurity doped depth that is more than an impurity doped depth of the first emitter portion.

The selective heating includes at least one of laser beams irradiating the substrate along an extension direction of the at least one finger electrode.

The first and second emitter portions may be formed on a light receiving surface of the substrate and the second electrode is formed on an opposite surface of the substrate to the light receiving surface.

The method may further include removing the insulation layer after the second emitter portion is formed.

The method may further include forming an anti-reflection layer on the first and second emitter portions.

The forming of the first and second electrodes may include applying a first electrode paste on the anti-reflection layer corresponding to the second emitter portion to form a pattern of the at least one finger electrode, and heating the substrate having the pattern of the at least one finger electrode.

The forming of the pattern of the at least one finger electrode may include forming a pattern of at least one bus electrode to intersect the pattern of the at least one finger electrode along with the pattern of the at least one finger electrode.

The method may further include applying a second electrode paste on the substrate to form a pattern of the second electrode.

The heating of the substrate may heat the pattern of the second electrode along with the pattern of the at least one finger electrode.

According to another embodiment, a solar cell may include a substrate of a first conductive type, an emitter layer that is positioned on the substrate and is a second conductive type that is opposite to the first conductive type, first electrodes that are connected to the emitter layer, and a second electrode that is connected to the substrate, wherein the emitter layer comprises a first emitter portion and a second emitter portion, the first electrodes comprise a finger electrode, and a bus electrode intersecting and connected to the finger electrode, and the first emitter portion and the second emitter portion are positioned under the bus electrode.

The second emitter portion may have an impurity concentration that is more than an impurity concentration of the first emitter portion.

The second emitter portion may have an impurity doped depth that is more than an impurity doped depth of the first emitter portion.

The finger electrode may have a width of about 50 μm to 300 μm and the bus electrode has a width of about 1 mm to 3 mm.

The first emitter portion may have a width that is more than a width of the finger electrode.

The second emitter portion may have a thickness that is more than a thickness of the first emitter portion.

The solar cell may further include an anti-reflection layer positioned on the emitter layer and a back surface field portion positioned between the substrate and the second electrode.

BRIEF DESCRIPTION OF THE DRAWINGS

The present invention will become more apparent by describing example embodiments thereof in detail with reference to the accompanying drawings in which.

DETAILED DESCRIPTION

Figure 1:
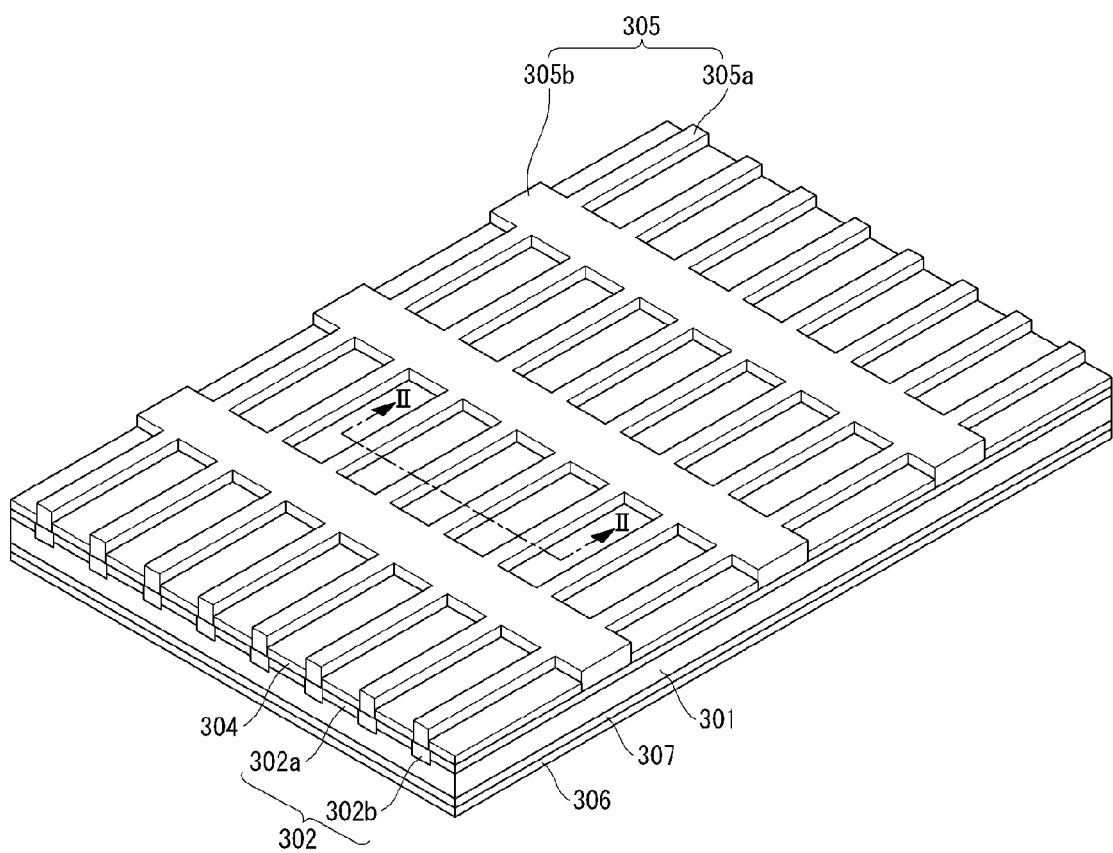
FIG. 1 is a partial perspective view of a solar cell according to an example embodiment of the present invention.

The present invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
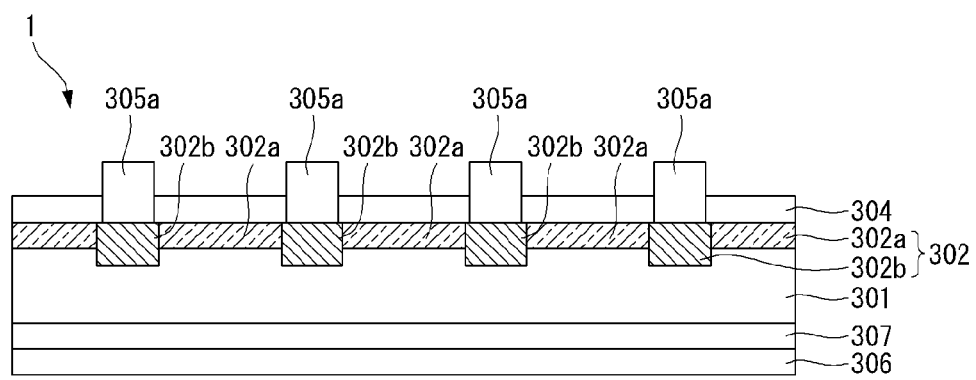
FIG. 2 is a sectional view of the solar cell shown in FIG. 2 taken along the line II-II.

Referring to FIGS. 1 and 2, shown is a solar cell according to an example embodiment of the present invention. FIG. 1 is a partial perspective view of a solar cell according to an example embodiment of the present invention and FIG. 2 is a sectional view of the solar cell shown in FIG. 2 taken along the line II-II.

Referring to FIGS. 1 and 2, a solar cell 1 according to an example embodiment of the present invention includes a substrate 301, an emitter layer 302 positioned on a surface of the substrate, an anti-reflection layer 304 positioned on the emitter layer 210, a plurality of first electrodes 305 (hereinafter, referred to as "front electrodes") electrically connected to the emitter layer 302, a second electrode 306 (hereinafter, referred to as "a rear electrode") positioned on an entire surface of the substrate 301 and electrically connected to the substrate 301, and a back surface field (BSF) layer 307 positioned between the substrate 301 and the rear electrode 306.

In the example embodiment, the substrate 301 is preferably made of silicon that is doped with an impurity of a first conductive type, for example, a p-type, though not required. At this time, silicon may be single crystal silicon, polycrystalline silicon, or amorphous silicon. When the substrate 301 is of a p-type, the substrate 301 includes an impurity of a group III element such as boron (B), gallium (Ga), Indium, etc. However, alternatively, the substrate 301 may be of an n-type, and/or be made of other materials than silicon. When the substrate 301 is of the n-type, the substrate 301 may include an impurity of a group V element such as phosphor (P), arsenic (As), antimony (Sb), etc.

The emitter layer 302 is referred to as an impurity portion that has a second conductive type, for example, an n-type, opposite to the conductive type of the substrate 301, and is positioned on a surface, that is, a front surface of the substrate 201, on which light is incident. Thus, in this embodiment, the front surface functions as a light receiving surface.

The emitter layer 302 includes a plurality of first emitter portions 302a and a plurality of second emitter portions 302b. The first emitter portions 302a and the second emitter portions 302b have different impurity concentration from each other. In this embodiment, an impurity concentration of the second emitter portions 302b is more than that of the first emitter portions 302a. In addition, an impurity doped depth of each second emitter portion 302b is larger than that of each first emitter portion 302a, and thereby a thickness of each second emitter portion 302b is more than that of each first emitter portion 302a. Thereby, since the impurity concentration and the doped depth of each second emitter portion 302b are larger than those of each first emitter portion 302a, the sheet resistance of the second emitter portions 302b is less than that of the first emitter portions 302a. In other embodiments, the impurity doped depth of each second emitter portion 302b need not be larger than those of each first emitter portion 302a so that the impurity doped depth of each second emitter portion 302b is about the same as or smaller than that of each first emitter portion 302a.

The emitter layer 302 forms a p-n junction with the substrate 301. By a built-in potential difference generated due to the p-n junction, a plurality of electron-hole pairs, which are generated by incident light onto the semiconductor substrate 301, are separated into electrons and holes, respectively, and the separated electrons move toward the n-type semiconductor and the separated holes move toward the p-type semiconductor. Thus, when the substrate 301 is of the p-type and the emitter layer 302 is of the n-type, the separated holes move toward the substrate 301 and the separated electrons move toward the emitter layer 302. Accordingly, the holes become major carriers in the substrate 301 and the electrons become major carriers in the emitter layer 302.

Because the emitter layer 302 forms the p-n junction with the substrate 301, when the substrate 301 is of the n-type, the emitter layer 302 is of the p-type, in contrast to the embodiment discussed above, the separated electrons move toward the substrate 301 and the separated holes move toward the emitter layer 302.

Returning to the embodiment when the emitter layer 302 is of the n-type, the emitter layer 302 may be formed by doping the substrate 301 with an impurity of the group V element such as P, As, Sb, etc., while when the emitter layer 302 is of the p-type, the emitter layer 302 may be formed by doping the substrate 301 with an impurity of the group III element such as B, Ga, etc.

In reference to FIG. 2, the anti-reflection layer 304 is preferably made of silicon nitride (SiNx) and/or silicon oxide (SiO$_2$), and is positioned on the emitter layer 302. The anti-reflection layer 304 reduces reflectance of light incident onto the substrate 301 and increases selectivity of a specific wavelength band, thereby increasing efficiency of the solar cell 1. The anti-reflection layer 304 may have a thickness of about 70 nm to 80 nm. The anti-reflection layer 304 may be omitted, if desired.

The plurality of front electrodes 305 include a plurality of finger electrodes 305a electrically connected to the second emitter portions 302b, and a plurality of bus electrodes 305b connected to the finger electrodes 305a. The finger electrodes 305a are spaced apart from each other by a predetermined distance to be parallel to each other and extend substantially in a direction on the second emitter portions 302b of the emitter layer 302. The bus electrodes 305b extend substantially in a direction intersecting the finger electrodes 305a, and are parallel to each other, though not necessary. That is, in the embodiment, each of the second emitter portions 302b is positioned directly under the corresponding finger electrode 305a.

The finger electrodes 305a collect charges, for example, electrons, moving toward the emitter layer 302 and transmit the charges to a desired position, and the bus electrodes 305b collects the electrons transmitted through the finger electrodes 305a and outputs those electrons externally.

Thereby, for improving a collection efficiency of the transmitted electrons, a width of each bus electrode 305b is more than that of each finger electrode 305a, though such is not required so that the width of each bus electrode 305b and each finger electrode 305a is about the same. In this embodiment, the width of the bus electrode 305b is preferably about 1 mm to about 3 mm and the width of the finger electrode 305a is preferably about 50 µm to about 300 µm.

In an embodiment of the present invention, the width of the finger electrode 305a is less than that of the corresponding second emitter portion 302b, but the width of the finger electrode 305a may be equal to or greater than that of the second emitter portion 302b.

As described above, each second emitter portion 302b is in contact with the overlying finger electrode 305a, and thereby functions as an ohmic contact reducing the contact resistance with the finger electrode 305a. On the other hand, the bus electrode 305b overlies both the first emitter portion 302a and the second emitter portion 302b.

The front electrodes 305 are preferably made of at least one conductive metal material. Examples of the conductive metal material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used.

The rear electrode 306 is positioned on the entire rear surface of the substrate 301 which is opposite to the light receiving surface, and is electrically connected to the substrate 301. The rear electrode 306 collects charges, for example, holes, moving toward the substrate 301.

The rear electrode 306 is preferably made of a conductive metal material. Examples of the conductive metal material may be at least one selected from the group consisting of Ni, Cu, Ag, Al, Sn, Zn, In, Ti, Au, and a combination thereof. Other conductive metal materials may be used.

The back surface field layer 307 is positioned between the rear electrode 306 and the substrate 301. The back surface field layer 307 is an area heavily doped with an impurity of the same conductive type as the substrate 301, and thereby, in this embodiment, the back surface field layer 307 is an area of a p$^+$-type. A potential barrier is formed by an impurity concentration difference between the substrate 301 and the back surface field layer 307, thereby distributing the movement of carriers (for example, electrons) to a rear portion of the substrate 301. Accordingly, the back surface field layer 307 prevents or reduces the recombination and/or the disappearance of the separated electrons and holes in the interface of the substrate 301 and the rear electrode 306.

An operation of the solar cell 1 of the structure will be described in detail. When light irradiated to the solar cell 1 is incident on the substrate 301 of the semiconductor through the anti-reflection layer 304 and the emitter layer 302, a plurality of electron-hole pairs are generated in the substrate 301 by light energy based on the incident light. At this time, since a reflection loss of light incident onto the substrate 301 is reduced by the anti-reflection layer 304, an amount of the incident light on the substrate 301 increases.

The electron-hole pairs are separated by the p-n junction of the substrate 301 and the emitter layer 302, and the separated electrons move toward the emitter layer 302 of the n-type and the separated holes move toward the substrate 301 of the p-type. The electrons moved toward the emitter layer 301 are collected by the finger electrodes 305a of the front electrodes 305 to be transmitted along the finger electrodes 305a, and are then collected by the bus electrodes 305b connected to the finger electrodes 305a, while the holes moved toward the substrate 301 are collected by the rear electrode 306. When the bus electrodes 305b and the rear electrode 306 are connected with electric wires (not shown), current flows therein to thereby enable use of the current for electric power.

At this time, since the finger electrodes 305a are directly in contact with the second emitter portions 302b heavily doped with the impurity of the n-type, for example, the contact power between the emitter layer 302 and the finger electrodes 305 improves, and thereby transmission efficiency of the electrons increases to improve efficiency of the solar cell 1.

Next, referring to FIGS. 3 to 12, a method for manufacturing a solar cell according to an example embodiment of the present invention.

Figure 10:
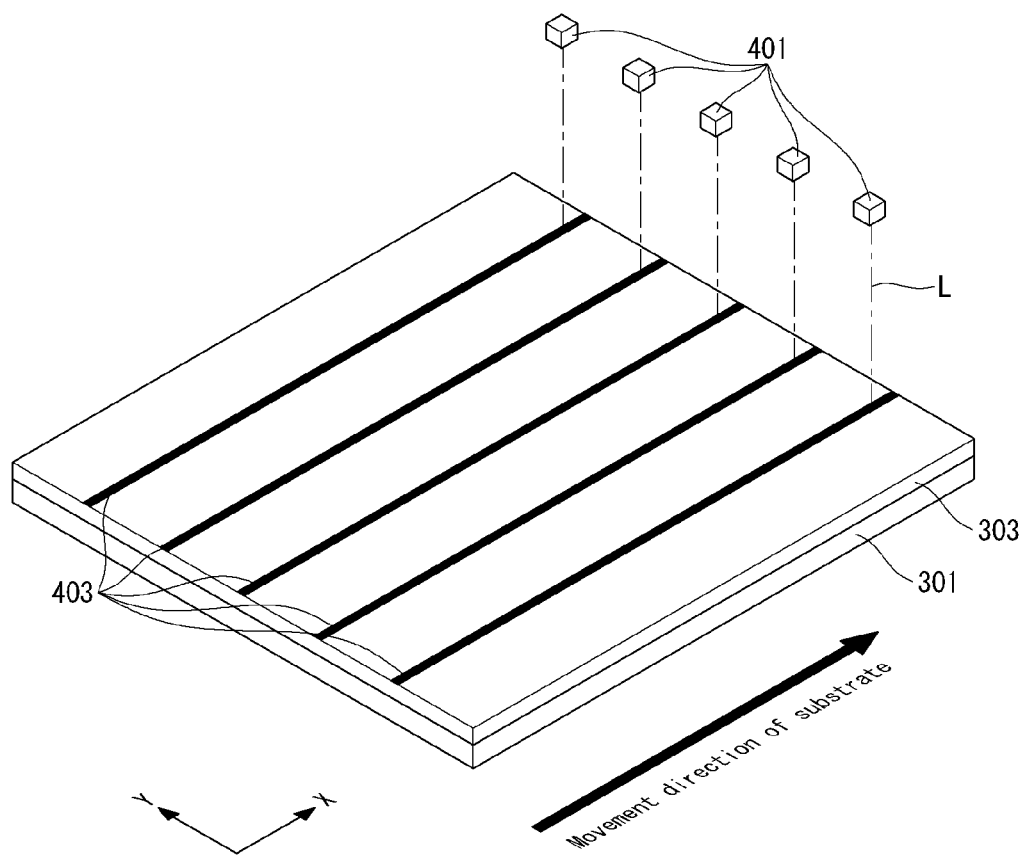
FIG. 10 is an example schematically showing a selective annealing method of an insulation layer according to an example embodiment of the present invention.
Figure 11:
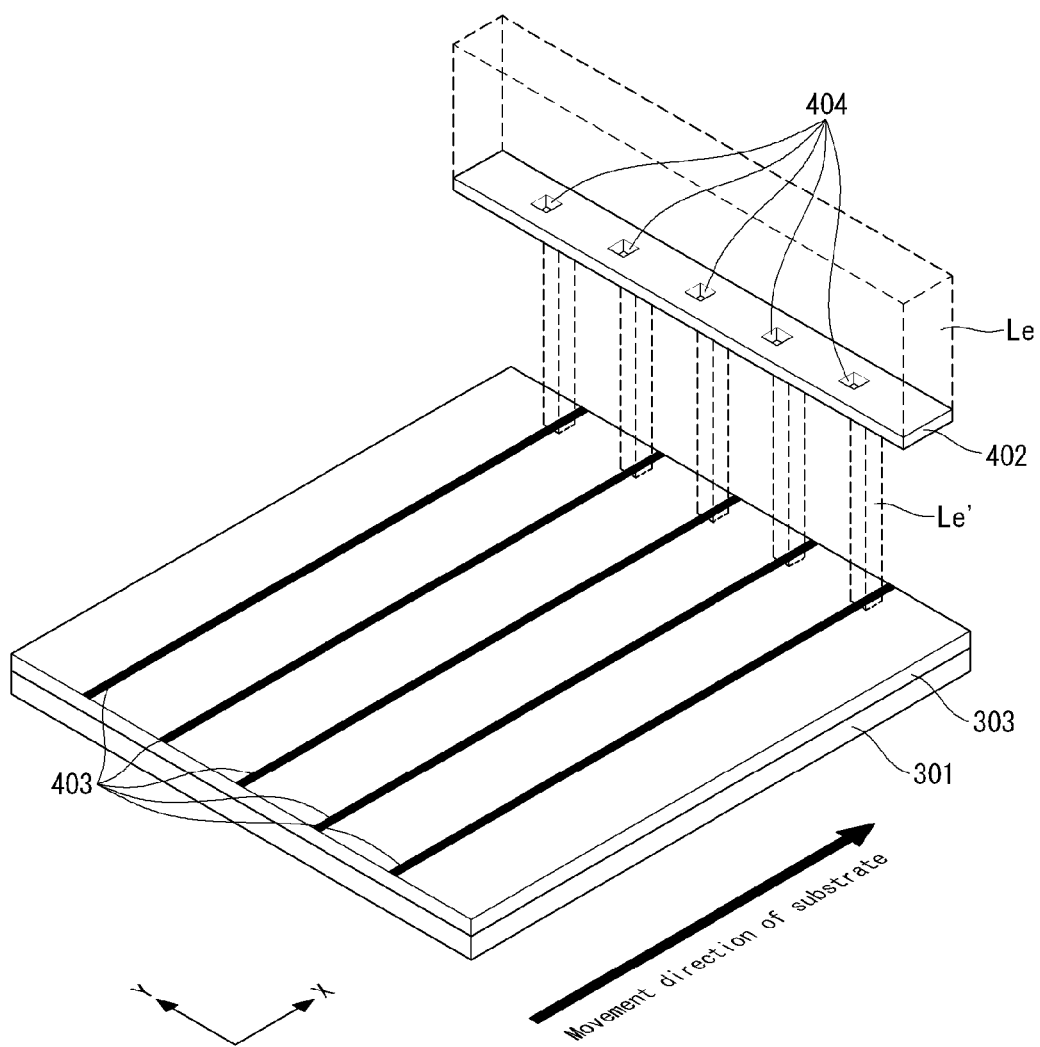
FIG. 11 is another example schematically showing a selective annealing method of an insulation layer according to an example embodiment of the present invention.
Figure 12:
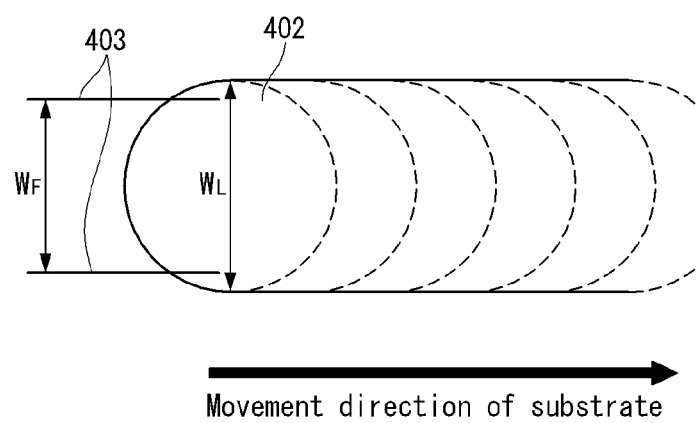
FIG. 12 shows a relationship of a laser beam irradiation width and a width of a finger electrode in selectively annealing an insulation layer according to an example embodiment of the present invention.

FIGS. 3 to 9 are sectional views sequentially showing processes for manufacturing a solar cell according to an example embodiment of the present invention. FIG. 10 is an example schematically showing a selective annealing method of an insulation layer according to an example embodiment of the present invention and FIG. 11 is another example schematically showing a selective annealing method of an insulation layer according to an example embodiment of the present invention. In addition, FIG. 12 shows a relationship of a laser beam irradiation width and a width of a finger electrode in selectively annealing an insulation layer according to an example embodiment of the present invention.

Figure 3:
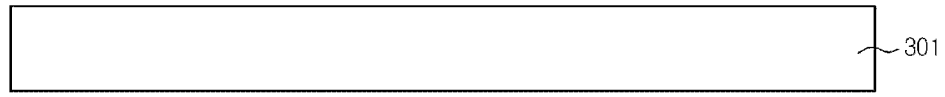
FIGS. 3 to 9 are sectional views sequentially showing processes for manufacturing a solar cell according to an example embodiment of the present invention.

As shown in FIG. 3, a method for manufacturing a solar cell according to an example embodiment of the present invention, first, includes preparing a substrate 301 doped with an impurity of a first conductive type. The substrate 301 may be made of single crystal silicon, polycrystalline silicon, or amorphous silicon, and a material of the substrate 301 may be varied, and need not be limited to silicon.

The first conductive type of the substrate 301 may be a p-type or an n-type. However, when the substrate 301 has a conductive type of a p-type, lifetime and mobility of minority carriers (electrons) are larger than those of majority carriers. Accordingly, preferably, though not required, the substrate 301 has the conductive type of the p-type. At this time, the substrate 301 of the p-type includes a group III element such as B, Ga, In, and etc.

The substrate 301 may be a substrate that underwent a wet etching process, etc., to remove damaged portions generated on a surface of the substrate 301 in a slicing process of a silicon.

Figure 4:
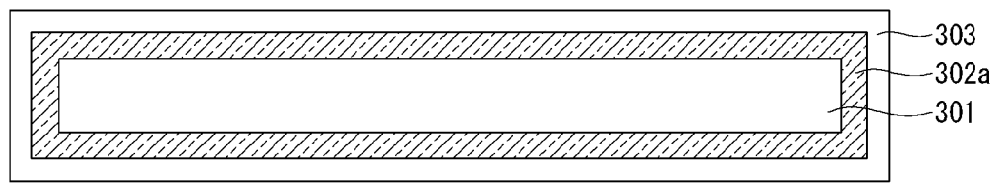

Next, referring to FIG. 4, an first emitter portion 302a and an insulation layer 303 are formed by doping an impurity of a second conductive type opposite (or different) to the first conductive type into the substrate 301.

The first emitter portion 302a forms a p-n junction with the substrate 301. Accordingly, when the substrate 301 is a p-type, the first emitter portion 302a is an n-type and is thereby doped with an impurity of a group V element such as P, As, Sb, etc.

The formation of the insulation layer 303 and the first emitter portion 302a will be described in detail below. For example, the substrate 301 is placed in a diffusion furnace and an oxygen ($O_2$) gas and an impurity gas of the second conductive type (e.g., n-type) are injected in the diffusion furnace, to diffuse the impurity of the second conductive type into the substrate 301. Accordingly, the first emitter portion 302a including the impurity of the second conductive type is formed. At this time, the insulation layer 303 that is an oxide including the impurity is formed on the substrate 301 by reacting of the oxygen ($O_2$) and the impurity gas. Here, when the substrate 301 is the p-type, the impurity gas may be $POCl_3$, and thereby the insulation layer 303 is PSG (phosphorus silicate glass), such as $P_2O_5$.

Instead of the formation of the first emitter portions 302a using the diffusion of the impurity gas in the diffusion furnace, in an alternative embodiment, the first emitter portions 302a may be formed by using a spraying, a screen printing using a paste, etc. In this case, after coating an impurity source including the p-type or n-type impurity on the substrate 301 by the spraying of the impurity, or printing a doping paste containing the impurity on the substrate 301 by the screen printing, a heating process is performed on the substrate 301 to diffuse the impurity into the substrate 301. At this time, the insulation layer 303 including the impurity is formed on the substrate 301. In this case, the insulation layer 303 is PSG (phosphorus silicate glass), such as $P_2O_5$.

Figure 5:
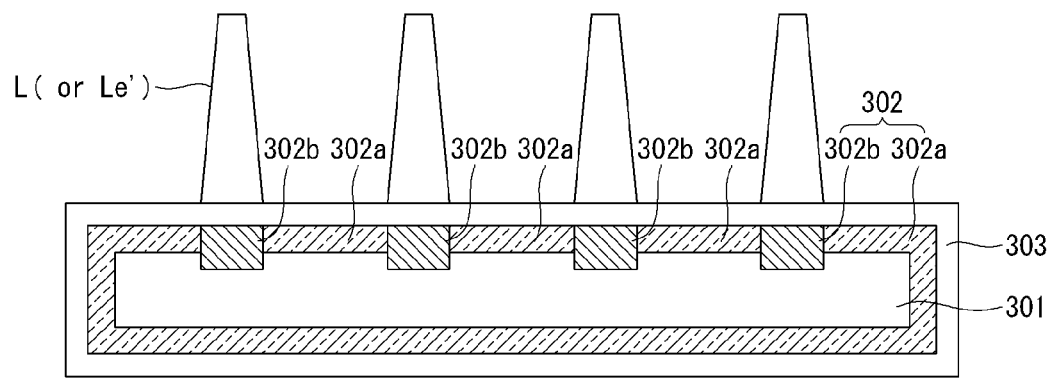

After the first emitter portion 302a is formed, as shown in FIG. 5, laser beams L or Le' are selectively irradiated on the insulation layer 303, to thereby anneal (or heat) portions of the insulation layer 303 on which the laser beams L or Le' are irradiated. At this time, irradiation positions of the laser beams L or Le' correspond to formation positions of the finger electrodes 305a shown in FIGS. 1 and 2. In addition, the irradiated laser beams L or Le' preferably have an energy density that does not damage the first emitter portion 302a underlying the insulation layer 303 by laser ablation.

Next, a selective annealing method for selectively irradiating the laser beams L or Le' onto the insulation layer 303 will be described in reference to FIGS. 10 to 12.

First, referring to FIG. 10, an example of the selective annealing method of the insulation layer 303 will be described. That is, as shown in FIG. 10, after the substrate 301 with the insulation layer 303 is placed on a stage (not shown) for annealing, a plurality of laser irradiation equipments 401 are positioned at annealing positions 403.

Next, when laser beams L emitted from the laser irradiation equipments 401 are irradiated, the laser beams L are directly irradiated at the desired (or selective) positions 403 as the substrate 301 is moved in an extension direction of the finger electrodes 305a, for example, an X-axis direction. Thus, the irradiation positions of the laser beams L are moved along only the extension direction of the finger electrodes 305a.

At this time, as shown in FIG. 12, since a laser beam irradiation width WL is more than a width WF of the finger electrode 305a, a sufficient annealing operation is performed at the annealing positions 304. Thereby, without the movement of the irradiation positions of the laser beams L by a predetermined distance in a Y-axis direction, by moving the irradiation positions of the laser beams L only in the X-axis direction that is the extension direction of the finger electrodes 305a, desired portions 403 of the insulation layer 303 are heated and/or annealed. Thus, only portions of the insulation layer 303 corresponding to the finger electrodes 305a are heated by the laser beams L, while portions of the insulation layer 303 corresponding to the bus electrodes 305b are not heated by the laser beams L. In other embodiments, the laser beam irradiation width WL may be equal to or less than the width WF of the finger electrode 305a.

Meanwhile, unlike FIG. 10, where the substrate 301 is moved, after the substrate 301 is located or fixed, the laser irradiation equipments 401 may be moved in the extension direction of the finger electrodes 305 to irradiate the laser beams L to the positions 403. In other example embodiments, both the substrate 301 and the laser irradiation equipments 401 may be moved in the extension direction of the finger electrodes 305, relative to each other, for example.

Since the positions 403 contacting with the finger electrodes 305a are simultaneously heated and/or annealed by one laser scan process, and/or the laser beam irradiation width WL is more than the width WF of the finger electrode 305a, desired heated and/or annealed areas are obtained by only one heating and/or annealing operation. Accordingly, when desired portions of the insulation layer 303 are selectively heated and/or annealed, the number of laser beam irradiation decreases, a manufacturing time of the solar cell decreases, a manufacturing process of the solar cell is simplified, and/or productivity for the solar cell increases.

As described above, controlling the energy density of the laser beams L and the number of laser beam irradiation to be low, laser ablation at the laser irradiation positions 403 is reduced or prevented. In the embodiment, the energy density of the laser beams L may be about 0.3 $J/cm^2$ to about 1.2 $J/cm^2$, and the number of laser beam irradiation may be about 2 times to about 20 times.

When the energy density of the laser beams L is less than about 0.3 $J/cm^2$, the irradiation positions 403 are not sufficiently heated or melted and thereby an additional diffusion of the impurity included in the insulation layer 303 into the substrate 301 is not normally performed. On the contrary, when the energy density of the laser beams L is greater than about 1.2 $J/cm^2$, the irradiation positions 403 are excessively heated or melted, and thereby mass transfer occurs at the excessively heated or the melted positions. Therefore, there may be problems that surfaces of the laser irradiation positions 403 become rough and/or the sheet resistance increases.

However, the energy density of the laser beams L is varied based on characteristics of the insulation layer 303 such as a thickness and a kind thereof, and the number of laser irradiation is varied based on the characteristics of the insulation layer 303, the energy density, etc.

Another example of the selective annealing method of the insulation layer 303 uses excimer laser beams Le irradiating a large area at one time. That is, as shown in FIG. 11, the excimer laser beams Le are irradiated to a mask 402 including holes 404, and then groups of laser beams Le' passing the holes 404 are simultaneously irradiated to the positions 403 corresponding to the finger electrodes 305a. At this time, unlike FIG. 10, the excimer laser beams Le are emitted from one laser irradiation equipment (not shown). However, like FIG. 10, for irradiating the laser beams Le' at the desired portions of the insulation layer 303, one or both of the substrate 301 and the laser irradiation equipment may be moved in a desired direction, for example, the extension direction of the finger electrodes 305a.

Like the case of FIG. 10, as shown in FIG. 12, a laser beam width is more than the width WF of the finger electrode 305a for sufficiently annealing the desired positions 403, but the laser beam width may be equal to or less than the width WF of the finger electrode 305a. An energy density of the laser beams Le and the number of laser irradiation are defined not to generate the laser ablation. The energy density and the number of laser irradiation may be varied based on the characteristics of the insulation layer 303, etc.

Accordingly, like the case of FIG. 10, the selective annealing process of the insulation layer 303 is simplified, thereby a manufacturing time of the solar cell decreases, and the productivity of the solar cell increases.

However, the insulation layer 303 may be selectively annealed by various manners besides the method based on FIGS. 10 and 11. For example, laser beams may be divided into a plurality of laser beam groups corresponding to the number of finger electrodes 305a using at least one half mirror, polygon mirror, or diffractive optical element to be irradiated at the desired positions 403 corresponding to the finger electrodes 305a.

When the insulation layer 303 is selectively heated and/or annealed by various manners, as described above, the portions of the insulation layer 303 to which the laser beams L or Le' are irradiated are heated at a high temperature, and thereby impurity concentrations and impurity diffusion depths of the underlying second emitter portions 302b increase to form a plurality of second emitter portions 302b.

Figure 6:
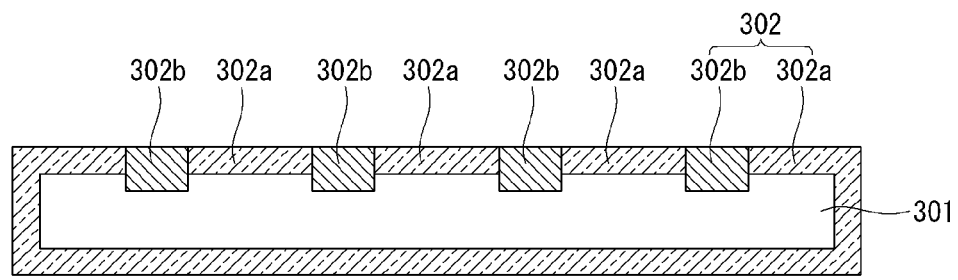

That is, since the impurity included in the annealed portions of the insulation layer 303 and having the second conductive type are additionally diffused in portions of the underlying first emitter portion 302a, the portions of the first emitter portion 302a are changed into the second emitter portions 302b having the heavily impurity concentrations and the large doped depths. At this time, by the second emitter portions 302b, the first emitter portion 302a is divided into plural portions. After the emitter layer 302 is completed by the formation of the second emitter portions 302b, as shown in FIG. 6, the insulation layer 303 positioned on the substrate 301 is removed. At this time, the insulation layer 303 may be removed by various manners such as a wet etching using HF.

Figure 7:
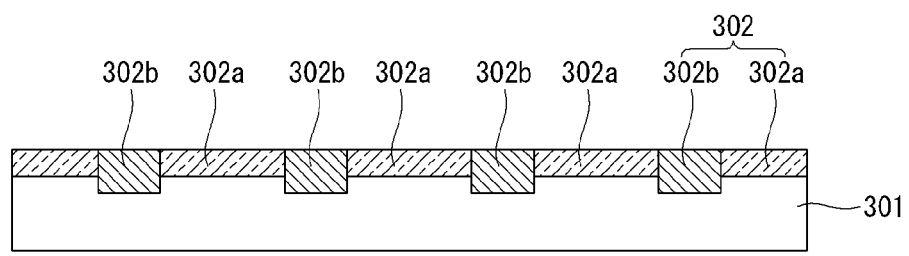

Next, referring to FIG. 7, an edge isolation process is performed to remove the first emitter layers 302a formed at lateral and rear sides of the substrate 301, except for a front side of the substrate 301. An example of the edge isolation process is performed by immersing the substrate 301 in a bath including a wet etchant of mixed HF, $HNO_3$, and $H_2O$ for a predetermined time, after protecting the first emitter portion 302a on the front side of the substrate 301 from the etchant. However, the edge isolation process may be performed by various manners such as the using of laser beams.

Figure 8:
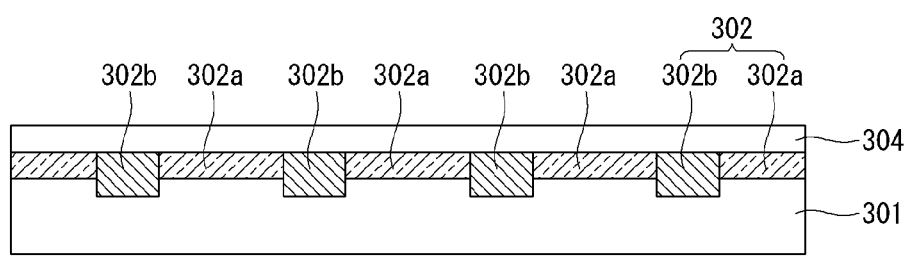

Next, referring to FIG. 8, an anti-reflection layer 304 is formed on the emitter layer 302. The anti-refection layer 304 reduces reflectance of incident light. The anti-reflection layer 304 may be preferably made of silicon nitride (SiNx). The anti-reflection layer 304 may be formed by a plasma enhanced chemical vapor deposition (PECVD), a chemical vapor deposition (CVD), or a sputtering. In alternative embodiment, a passivation layer made of silicon oxide ($SiO_2$), silicon nitride (SiNx), and/or silicon oxy-nitride (SiOxNy) may further be formed before the anti-reflection layer 304, so that the passivation layer may be a single layer of one silicon containing component or multiple layers with one or more silicon containing components.

Figure 9:
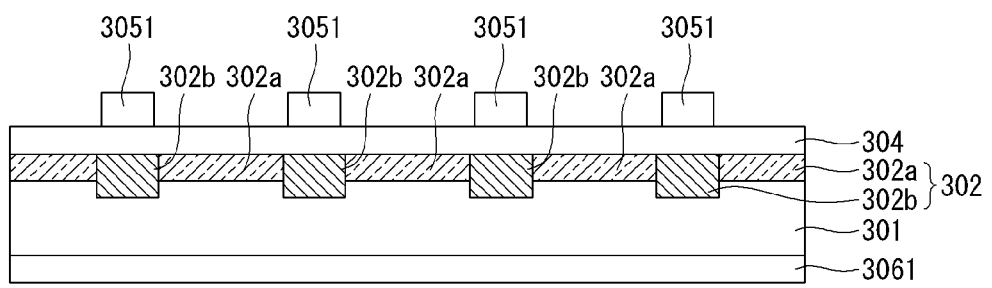

Next, referring to FIG. 9, a front electrode paste is printed on the anti-reflection layer 304 by using a screen printing to simultaneously form front electrode patterns with finger electrode patterns 3051 and bus electrode patterns intersecting the finger electrode patterns 3051. At this time, the finger electrode patterns 3051 correspond to the second emitter portions 302b. The front electrode paste preferably includes Ag and glass frits, though not required. Next, a rear electrode paste is printed on a rear surface of the substrate 301 to forma rear electrode pattern 3061. The rear electrode paste preferably includes aluminum (Al). At this time, the printing order of the front electrode patterns and the rear electrode pattern 3061 may be changed.

Next, a heating process is performed on the substrate 301 with the front electrode patterns and the rear electrode pattern 3061 to forma plurality of front electrodes 305, that is, a plurality of finger electrodes 305a and a plurality of bus electrodes 305b, contacting with the emitter layer 302, a rear electrode 306 contacting with the substrate 301, respectively, and a back surface field layer 307. Accordingly, a solar cell 1 is completed shown in FIG. 1.

That is, by the heating process, the front electrode patterns are in contact with the emitter layer 302 by penetrating the anti-reflection layer 304. In detail, the bus electrode patterns are contacted with the first emitter portions 302a, the finger electrode patterns 3051 are contacted with the second emitter portions 302b, and the rear electrode pattern 3061 is in contact with the substrate 301. Accordingly, the finger electrodes 305a are contacted with only the second emitter portions 302b, while the bus electrode 305b are contacted with both the first emitter portions 302a and the second emitter portions 302b. Also, when the intersection portions of the finger electrodes 305a and the bus electrodes 305b are excluded, the finger electrodes 305a are contacted with only the second emitter portions 302b, and the bus electrode 305b are only contacted with the first emitter portions 302a.

In addition, by the heating process, since Al included in the rear electrode paste is doped in the substrate 301, the back surface field layer 307 is formed. The back surface field layer 307 has an impurity concentration heavier than that of the substrate 301. As described above, since Al is the group III element, the back surface field layer 307 has a conductive type of a $P^+$-type, and thereby prevents the recombination of the electrons and the holes and helps the movement of the holes toward the rear electrode 306.

Since the front electrodes 305 include Ag, the front electrodes 305 have good electric conductivity. In addition, since the rear electrode 306 includes Al having good affinity with silicon, the rear electrode 306 has good contact with the substrate 301 as well as the good electric conductivity.

In embodiments of the present invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
    a substrate of a first conductive type;
    an emitter layer that is positioned on the substrate and is a second conductive type that is opposite to the first conductive type;
    first electrodes that are connected to the emitter layer; and
    a second electrode that is connected to the substrate,
    wherein the emitter layer comprises a first emitter portion and a second emitter portion,
    the first electrodes comprise a finger electrode, and a bus electrode intersecting and connected to the finger electrode, the first emitter portion and the second emitter portion are positioned under the bus electrode,
    the plurality of finger electrodes and the plurality of bus electrode are formed on a surface of the substrate and are coplanar, and
    the plurality of first emitter portions extend from the surface of the substrate to a first doped depth, and the plurality of second emitter portions extend from the surface of the substrate to a second doped depth that is different from the first doped depth.

2. The solar cell of claim 1, wherein the second emitter portion has an impurity concentration that is more than an impurity concentration of the first emitter portion.

3. The method of claim 1, wherein the second emitter portion has an impurity doped depth that is more than an impurity doped depth of the first emitter portion.

4. The solar cell of claim 1, wherein the second emitter portion has a thickness more than a thickness of the first emitter portion.

5. The solar cell of claim 1, further comprising an anti-reflection layer positioned on the emitter layer.

6. A solar cell, comprising:
    a substrate of a first conductive type;
    an emitter layer that is positioned on the substrate and is a second conductive type that is opposite to the first conductive type;
    first electrodes that are connected to the emitter layer; and
    a second electrode that is connected to the substrate,
    wherein the emitter layer comprises a plurality of first emitter portions and a plurality of second emitter portions,
    the first electrodes comprise a plurality of finger electrodes, and a plurality of bus electrodes intersecting and connected to the plurality of finger electrodes,
    the plurality of bus electrodes are formed over alternate ones of the plurality of first emitter portions and the plurality of second emitter portions,
    the plurality of finger electrodes and the plurality of bus electrode are formed on a surface of the substrate and are coplanar, and
    the plurality of first emitter portions extend from the surface of the substrate to a first doped depth, and the plurality of second emitter portions extend from the surface of the substrate to a second doped depth that is different from the first doped depth.

7. The solar cell of claim 6, wherein the plurality of second emitter portions have an impurity concentration that is more than an impurity concentration of the plurality of first emitter portions.

8. The solar cell of claim 6, wherein the plurality of second emitter portions have an impurity doped depth that is more than an impurity doped depth of the plurality of first emitter portions.

9. The solar cell of claim 6, wherein the plurality of second emitter portions have a thickness more than a thickness of the plurality of first emitter portions.

10. The solar cell of claim 6, further comprising an anti-reflection layer positioned on the emitter layer.

* * * * *